US009478326B2

(12) United States Patent
Ishida et al.

(10) Patent No.: US 9,478,326 B2
(45) Date of Patent: Oct. 25, 2016

(54) ELECTROCONDUCTIVE MICROPARTICLES, ANISOTROPIC ELECTROCONDUCTIVE MATERIAL, AND ELECTROCONDUCTIVE CONNECTION STRUCTURE

(71) Applicant: SEKISUI CHEMICAL CO., LTD., Osaka (JP)

(72) Inventors: Hiroya Ishida, Shiga (JP); Kiyoto Matsushita, Shiga (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 14/768,837

(22) PCT Filed: Feb. 28, 2014

(86) PCT No.: PCT/JP2014/055035
§ 371 (c)(1),
(2) Date: Aug. 19, 2015

(87) PCT Pub. No.: WO2014/133124
PCT Pub. Date: Sep. 4, 2014

(65) Prior Publication Data
US 2016/0005504 A1 Jan. 7, 2016

(30) Foreign Application Priority Data
Feb. 28, 2013 (JP) ................. 2013-039800

(51) Int. Cl.
| | |
|---|---|
| *H01B 1/22* | (2006.01) |
| *B23K 35/26* | (2006.01) |
| *B23K 35/02* | (2006.01) |
| *C22C 13/00* | (2006.01) |
| *H05K 3/32* | (2006.01) |
| *B22F 1/02* | (2006.01) |

(Continued)

(52) U.S. Cl.
CPC ........... *H01B 1/22* (2013.01); *B22F 1/025* (2013.01); *B23K 35/0244* (2013.01); *B23K 35/262* (2013.01); *C22C 13/00* (2013.01); *C23C 18/1635* (2013.01); *C23C 18/1651* (2013.01); *C23C 18/1653* (2013.01); *C25D 5/12* (2013.01); *H01B 1/02* (2013.01); *H01L 24/29* (2013.01); *H01L 24/83* (2013.01); *H05K 3/323* (2013.01); *H01L 24/27* (2013.01); *H01L 24/32* (2013.01); *H01L 2224/271* (2013.01); *H01L 2224/27003* (2013.01); *H01L 2224/2732* (2013.01); *H01L 2224/27312* (2013.01); *H01L 2224/27334* (2013.01); *H01L 2224/294* (2013.01); *H01L 2224/2929* (2013.01); *H01L 2224/2939* (2013.01); *H01L 2224/29339* (2013.01); *H01L 2224/29347* (2013.01); *H01L 2224/29355* (2013.01); *H01L 2224/29411* (2013.01); *H01L 2224/29439* (2013.01); *H01L 2224/29444* (2013.01); *H01L 2224/29455* (2013.01); *H01L 2224/29457* (2013.01); *H01L 2224/29464* (2013.01); *H01L 2224/29466* (2013.01); *H01L 2224/29469* (2013.01); *H01L 2224/29481* (2013.01); *H01L 2224/29487* (2013.01); *H01L 2224/32227* (2013.01); *H01L 2224/834* (2013.01); *H01L 2224/83191* (2013.01); *H01L 2224/83447* (2013.01); *H01L 2224/83815* (2013.01); *H01L 2224/83851* (2013.01); *H01L 2924/3512* (2013.01); *H01L 2924/3651* (2013.01); *H05K 2201/0218* (2013.01); *H05K 2201/0221* (2013.01); *H05K 2203/0425* (2013.01)

(58) Field of Classification Search
None
See application file for complete search history.

(56) References Cited

U.S. PATENT DOCUMENTS

| | | | | |
|---|---|---|---|---|
| 2010/0084765 A1* | 4/2010 | Lee | .......... | H01L 24/13 257/738 |
| 2011/0127068 A1* | 6/2011 | Wada | .......... | C08F 220/18 174/126.1 |
| 2013/0000964 A1* | 1/2013 | Kobayashi | .......... | H01B 1/22 174/257 |

FOREIGN PATENT DOCUMENTS

| | | |
|---|---|---|
| JP | 2001-220691 | 8/2001 |
| JP | 2003-68145 | 3/2003 |

(Continued)

OTHER PUBLICATIONS

International Search Report issued Apr. 1, 2014 in International (PCT) Application No. PCT/JP2014/055035.

(Continued)

*Primary Examiner* — Tanisha Diggs
(74) *Attorney, Agent, or Firm* — Wenderoth, Lind & Ponack, L.L.P.

(57) ABSTRACT

The present invention aims to provide electroconductive microparticles which are less likely to cause disconnection due to breakage of connection interfaces between electrodes and the electroconductive microparticles even under application of an impact by dropping or the like and are less likely to be fatigued even after repetitive heating and cooling, and an anisotropic electroconductive material and an electroconductive connection structure each produced using the electroconductive microparticles. The present invention relates to electroconductive microparticles each including at least an electroconductive metal layer, a barrier layer, a copper layer, and a solder layer containing tin that are laminated in said order on a surface of a core particle made of a resin or metal, the copper layer and the solder layer being in contact with each other directly, the copper layer directly in contact with the solder layer containing copper at a ratio of 0.5 to 5% by weight relative to tin contained in the solder layer.

12 Claims, 1 Drawing Sheet

(51) Int. Cl.
*C23C 18/16* (2006.01)
*C25D 5/12* (2006.01)
*H01B 1/02* (2006.01)
*H01L 23/00* (2006.01)

(56) References Cited

FOREIGN PATENT DOCUMENTS

| JP | 2004-179137 | 6/2004 |
| JP | 2007-81141 | 3/2007 |
| JP | 2009-117333 | 5/2009 |
| JP | 2009-224059 | 10/2009 |

OTHER PUBLICATIONS

Decision to Grant a Patent issued Jun. 12, 2014 in Japanese Application No. 2014-511974, with translation.

* cited by examiner

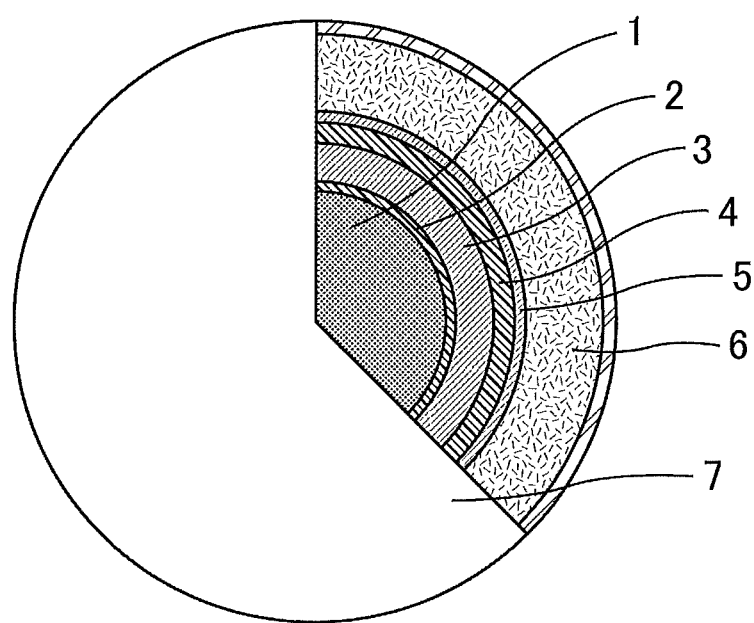

ELECTROCONDUCTIVE MICROPARTICLES, ANISOTROPIC ELECTROCONDUCTIVE MATERIAL, AND ELECTROCONDUCTIVE CONNECTION STRUCTURE

TECHNICAL FIELD

The present invention relates to electroconductive microparticles which are less likely to cause disconnection due to breakage of connection interfaces between electrodes and the electroconductive microparticles even under application of an impact by dropping or the like and are less likely to be fatigued even after repetitive heating and cooling. The present invention also relates to an anisotropic electroconductive material and an electroconductive connection structure each produced using the electroconductive microparticles.

BACKGROUND ART

ICs or LSIs, in a conventional way of producing an electronic circuit substrate, have been bonded onto a printed substrate through soldering of the electrodes thereof to the printed substrate. Soldering, however, does not enable effective bonding of the ICs or LSIs onto the printed substrate, and does not contribute to an increase in the packaging density of ICs or LSIs.

To solve the above problem, the ball grid array (BGA) technique has been developed which uses solder in a ball shape, so-called "solder balls", to bond ICs or LSIs onto the substrate. In the case of using the BGA technique, solder balls mounted on a chip or a substrate are molten at high temperatures, thereby bonding the substrate to the chip. As a result, the production efficiency of electronic circuit substrates is improved. Moreover, electronic circuit substrates with improved packaging density of chips can be produced.

However, multi-layer substrates have been more used in recent years, and those multi-layer substrates, sensitive to the environmental conditions, are sometimes distorted, expanded or contracted to cause disconnection of the connection portions between substrates.

For example, when a solder ball is used to connect a semiconductor to a substrate, the solder ball undergoes stress because the semiconductor and the substrate are different in the linear expansion coefficient. As a result, the solder ball may have a crack to cause disconnection.

To solve such a problem, Patent Literature 1 discloses electroconductive microparticles each including a resin fine particle, an electroconductive metal layer containing a highly conductive metal on the surface of the resin fine particle, and a solder layer formed on the surface of the electroconductive metal layer. Such electroconductive microparticles can ease the stress applied thereto with soft resin fine particles. Since a solder layer is formed on the outermost surface of each electroconductive microparticle, electrodes are easily conductively connected to each other.

When electroconductive microparticles each with a solder layer formed thereon are mounted on electrodes of substrates, the electroconductive microparticles are placed on an electrode formed on one substrate. The solder layer is molten by reflowing, so that the electroconductive microparticles are immobilized on the electrode. Then, the substrates are arranged in such a manner that an electrode formed on the other substrate faces the electrode formed on the one substrate, and reflowing is performed to conductively connect the electrodes of the substrates.

If electroconductive microparticles each including a core particle and a solder layer formed on the surface of the core particle as disclosed in Patent Literature 1 are used for conductive connection of electronic circuit substrates having currently dominant copper electrodes, however, disconnection is likely to occur due to breakage of connection interfaces under application of an impact by dropping or the like. During the use of an electronic device, electronic components generate heat to increase the temperature inside the electronic device. After the use, the temperature inside the electronic device is lowered to ambient temperature. In this manner, the electronic device is subjected to repetitive heating and cooling, i.e., a "heat cycle". Repetitive heat cycles also may cause breakage of connection interfaces between electrodes and electroconductive microparticles, resulting in disconnection.

CITATION LIST

Patent Literature

Patent Literature 1: JP-A 2001-220691

SUMMARY OF INVENTION

Technical Problem

The present invention aims to provide electroconductive microparticles which are less likely to cause disconnection due to breakage of connection interfaces between electrodes and the electroconductive microparticles even under application of an impact by dropping or the like and are less likely to be fatigued even after repetitive heating and cooling. The present invention aims to provide an anisotropic electroconductive material and an electroconductive connection structure each produced using the electroconductive microparticles.

Solution to Problem

The present invention relates to electroconductive microparticles each including at least an electroconductive metal layer, a barrier layer, a copper layer, and a solder layer containing tin that are laminated in said order on a surface of a core particle made of a resin or metal, the copper layer and the solder layer being in contact with each other directly, the copper layer directly in contact with the solder layer containing copper at a ratio of 0.5 to 5% by weight relative to tin contained in the solder layer.

The present invention is specifically described in the following.

The present inventors intensively studied about the cause of the disconnection due to breakage of connection interfaces under application of an impact by dropping or the like or after repetitive heat cycles when electroconductive microparticles each including a core particle and a solder layer formed on the surface of the core particle are used for conductive connection of electronic circuit substrates having copper electrodes. As a result, they found out that the cause is formation of a tin/copper intermetallic compound (hereafter, also simply referred to as an "intermetallic compound") on the connection interfaces. In other words, tin contained in the solder layer presumably incorporates a part of copper included in the electrodes when the solder layer is molten by heating upon reflowing. As a result, pure copper in the electrodes is reduced, and a large amount of an intermetallic compound is formed on the connection interfaces (hereafter, such a phenomenon is also referred to as "copper erosion"). Since the intermetallic compound is harder and more brittle than copper or solder, portions made of the intermetallic compound formed on the connection interfaces are presumably broken upon application of an impact by dropping or the like or after repetitive heat cycles, to cause disconnection.

The present inventors made further intensive studies to find out that, in the case where a solder layer is made in contact with a copper layer for the purpose of setting the ratio of copper to tin contained in the solder layer within a predetermined range, such electroconductive microparticles are less likely to cause disconnection due to breakage of connection interfaces even under application of an impact by dropping or the like or after repetitive heat cycles, thereby completing the present invention.

Directly contacting the solder layer of each electroconductive microparticle with the copper layer in advance allows copper from the copper layer to be preferentially diffused into the solder layer and dissolved therein when the solder layer is molten by heating upon reflowing. In such a case, "copper erosion" for further incorporating copper is suppressed to keep pure copper in the electrodes, and formation of a large amount of an intermetallic compound is avoided.

The electroconductive microparticles of the present invention each have a structure including at least an electroconductive metal layer, a barrier layer, a copper layer, and a solder layer containing tin that are laminated in said order on the surface of a core particle made of a resin or metal.

Examples of the resin forming the core particle include: polyolefin resins such as polyethylene resin, polypropylene resin, polystyrene resin, polyisobutylene resin, polybutadiene resin, polyvinyl chloride resin, polyvinylidene chloride resin, and polytetrafluoroethylene resin; acrylic resins such as polymethyl methacrylate resin, and polymethyl acrylate resin; and polyalkylene terephthalate resin, polysulfone resin, polycarbonate resin, polyamide resin, phenol formaldehyde resin, melamine formaldehyde resin, benzoguanamine formaldehyde resin, and urea-formaldehyde resin.

Examples of the metal forming the core particle include copper, nickel, and silver.

In particular, in the case of using resin core particles, even if a substrate conductively connected with the electroconductive microparticles of the present invention is distorted, expanded, or contracted due to a change in the environment, the electroconductive microparticles can ease the stress applied thereto with soft resin. In the case of using metal core particles, even if a chip generates heat, the particles are expected to transfer the heat to the substrate, thereby improving heat radiation.

In the case of resin core particles, the preferable lower limit of the 10% K value of the core particles is 1000 MPa and the preferable upper limit thereof is 15000 MPa, and the more preferable lower limit is 2000 MPa and the more preferable upper limit is 10000 MPa, in terms of the shape of electroconductive microparticles when the microparticles are compression-deformed and damage to the electrode.

The 10% K value can be determined by measuring, with a microcompression tester (e.g., "PCT-200" produced by Shimadzu Corporation), the compression displacement (mm) of the resin core particles when the particles are compressed by a flat end face of a diamond column indenter (diameter of 50 μm) under the conditions of a compression speed of 2.6 mN/second and a maximum test load of 10 g; and substituting the values into the following equation.

$$K \text{ value } (N/mm^2) = (3/\sqrt{2}) \cdot F \cdot S^{-3/2} \cdot R^{-1/2}$$

F: Force (N) in 10% compressive deformation of resin core particles

S: Compression displacement (mm) in 10% compressive deformation of resin core particles R: Radius (mm) of resin core particles The preferable lower limit of the average particle size of the core particles is 10 μm and the preferable upper limit thereof is 2000 μm, in terms of the dispersibility of the core particles and electroconductive microparticles and the usability as an anisotropic electroconductive material. The more preferable lower limit of the average particle size is 30 μm and the more preferable upper limit thereof is 1500 μm. The still more preferable lower limit of the average particle size is 50 μm and the still more preferable upper limit thereof is 1000 μm.

The average particle size of the core particles means the average of diameters obtained by measuring 50 core particles selected at random with an optical microscope or electron microscope.

The preferable upper limit of the CV value of the particle size of the core particles is 15% in terms of the connection reliability of the electroconductive microparticles. The more preferable upper limit of CV value is 10%. The CV value is a numerical value in percentage (%) obtained by dividing the standard deviation by the average particle size.

The resin core particles may be produced by any method, and examples of the method include a polymerization method, a method using a polymer protectant, and a method using a surfactant.

The polymerization method is not particularly limited, and examples thereof include emulsion polymerization, suspension polymerization, seed polymerization, dispersion polymerization, and dispersion seed polymerization.

The electroconductive metal layer has a function of enhancing the electrical connection reliability between the electroconductive microparticles and the electrodes.

The electroconductive metal layer may be formed directly on each core particle. Alternatively, a base metal layer such as a nickel layer may be formed between the electroconductive metal layer and the core particle.

Examples of the metal forming the electroconductive metal layer include gold, silver, copper, platinum, palladium, cobalt, and nickel. In particular, the electroconductive metal layer preferably contains copper because copper exerts an excellent effect of enhancing the electrical connection reliability between the electroconductive microparticles and the electrodes.

The thickness of the electroconductive metal layer is not particularly limited. In terms of the electroconductivity and the flexibility of the electroconductive microparticles, the preferable lower limit of the thickness is 1 μm and the preferable upper limit thereof is 70 μm. The more preferable lower limit of the thickness of the electroconductive metal layer is 3 μm and the more preferable upper limit thereof is 50 μm.

The thickness of the electroconductive metal layer is determined by measuring the cross sections of 10 electroconductive microparticles selected at random with a scanning electron microscope (SEM), and arithmetically averaging the measured values.

The barrier layer is positioned between the electroconductive metal layer and the copper layer and has a function of preventing diffusion of a metal contained in the electroconductive metal layer into the solder layer upon reflowing. Especially when the electroconductive metal layer contains copper, pure copper is reduced due to copper erosion upon reflowing, and a large amount of an intermetallic compound is formed. As a result, the electroconductive metal layer is embrittled to cause disconnection. Moreover, reduction of pure copper may possibly impair the electrical characteristics (electroconductivity).

Exemplary materials of the barrier layer include nickel, titanium, tantalum, titanium nitride, zirconia, and zirconia nitride. In particular, the barrier layer preferably contains nickel because formation of the barrier layer becomes easy. The barrier layer preferably has an amorphous structure. Specific examples of the amorphous barrier layer include a nickel-phosphor layer and a nickel-boron layer. When the barrier layer has an amorphous structure, copper is less likely to be diffused into the solder layer because the grain boundary is reduced.

The thickness of the barrier layer is not particularly limited. From the standpoint of preventing diffusion of a metal such as copper into the solder layer or formation of a hard and brittle intermetallic compound on the interface between the solder layer and the electroconductive metal layer, the preferable lower limit of the thickness is 0.2 μm and the preferable upper limit thereof is 5 μm. The more preferable lower limit of the thickness of the barrier layer is 0.5 μm and the more preferable upper limit thereof is 3 μm.

The thickness of the barrier layer is determined by measuring the cross sections of 10 electroconductive microparticles selected at random with a scanning electron microscope (SEM); and arithmetically averaging the measured values.

The electroconductive microparticles of the present invention each include a copper layer and a solder layer formed to be directly in contact with each other on the outer side of the barrier layer.

The solder layer has a function of electroconductively connecting the electrodes of the substrates by being molten by heating upon reflowing. The solder layer is preferably formed on the outermost surface of the electroconductive microparticles.

The solder layer contains tin.

The solder layer preferably further contains silver. The solder layer containing silver can have a comparatively low melting point and high strength.

The silver content of the solder layer is not particularly limited. The preferable lower limit of the ratio of silver to tin is 0.5% by weight and the preferable upper limit thereof is 10% by weight. When the silver content is within this range, a comparatively low melting point and high strength are both achieved.

The solder layer may contain, in addition to tin and silver, metals such as antimony, bismuth, indium, germanium, aluminum, zinc, nickel, and cobalt. The solder layer may contain copper at a predetermined percentage as described later.

The thickness of the solder layer is not particularly limited. In terms of the bondability to the electrodes and dispersibility of the electroconductive microparticles upon formation of the solder layer, the preferable lower limit of the thickness is 1 μm and the preferable upper limit thereof is 50 μm. The more preferable lower limit of the thickness of the solder layer is 3 μm and the more preferable upper limit thereof is 40 μm.

The thickness of the solder layer is determined by measuring the cross sections of 10 electroconductive microparticles selected at random with a scanning electron microscope (SEM); and arithmetically averaging the measured values.

The copper layer is formed in such a manner as to be directly in contact with the solder layer. The copper layer directly in contact with the solder layer allows copper in the copper layer to be preferentially diffused into the solder layer upon heat-melting to set the copper concentration of the solder layer within a predetermined range. In such a case, "copper erosion" is suppressed so that pure copper in the electrodes are kept. As a result, formation of a large amount of an intermetallic compound on the connection interfaces can be prevented.

The lower limit of the ratio of copper contained in the copper layer directly in contact with the solder layer relative to tin contained in the solder layer is 0.5% by weight and the upper limit thereof is 5% by weight. If the ratio of copper is less than 0.5% by weight, diffusion of the copper into the solder layer upon reflowing fails to increase the copper concentration sufficiently, and "copper erosion" cannot be sufficiently suppressed. In such a case, pure copper in the electrodes cannot be kept, leading to a failure in prevention of formation of an intermetallic compound on the connection interfaces. If the ratio of copper is more than 5% by weight, the concentration of copper diffused into the solder layer upon reflowing is too high. In such a case, the melting point of solder increases to have an influence on mountability. The preferable upper limit of the ratio of copper contained in the copper layer directly in contact with the solder layer relative to tin contained in the solder layer is 3% by weight.

For sufficient suppression of "copper erosion" and prevention of an increase in the melting point of solder, it is important to set the concentration of copper diffused into the solder layer when heat-melting the solder layer upon reflowing, within a predetermined range. In other words, the preferable lower limit of the concentration of the copper, at any given point of the solder layer, after heating at 150° C. for 12 hours is 0.5% by weight and the preferable upper limit thereof is 40% by weight, and the more preferable lower limit is 0.7% by weight and the more preferable upper limit is 30% by weight. The ratio of copper contained in the copper layer directly in contact with the solder layer is determined to set the concentration of copper diffused into the solder layer when heat-melting the solder layer upon reflowing, within the above mentioned range.

In the electroconductive microparticles of the present invention, at least one of nickel and cobalt may be further adhered to the surface of the solder layer. At least one of nickel and cobalt adhered to the surface of the solder layer micronizes the crystal structure of an intermetallic compound formed on the connection interfaces between the electroconductive microparticles and the electrodes after reflowing. Such electroconductive microparticles are further less likely to cause disconnection due to breakage of the connection interfaces even under application of an impact by dropping or the like or repetitive heat cycles.

The adhesion herein refers to a state where a metal (at least one of nickel and cobalt) is present on the surface of the solder layer but a metal layer of at least one of nickel and cobalt completely covering the surface of the solder layer is not formed.

FIG. 1 is a schematic view illustrating a preferred embodiment of the electroconductive microparticles of the present invention.

The electroconductive microparticle shown in FIG. 1 includes, on the surface of a resin core particle 1, a base metal layer 2, an electroconductive metal layer 3, a barrier layer 4, a copper layer 5, and a solder layer 6 formed in said order. On the surface of the solder layer 6, at least one of nickel and cobalt 7 is adhered.

The electroconductive microparticles of the present invention may be produced by any method, and a conventionally known method may be employed. For example, the electroconductive microparticles of the present invention having a structure as illustrated in FIG. 1 can be produced by the following method.

When an electroconductive metal layer is formed on the surface of a resin core particle, a nickel layer (hereafter, also referred to as a base nickel plating layer) as a base plating layer is formed on the surface of the core particle by electroless plating.

Next, an electroconductive metal layer is formed on the surface of the base nickel plating layer.

The method for forming the electroconductive metal layer is not particularly limited, and examples thereof include electrolytic plating and electroless plating.

On the surface of the electroconductive metal layer, a barrier layer such as a nickel layer is formed.

The method for forming the nickel layer is not particularly limited, and examples thereof include electrolytic plating and electroless plating.

On the surface of the barrier layer, a copper layer is formed.

The method for forming the copper layer is not particularly limited, and examples thereof include electrolytic plating and electroless plating.

Then, a solder layer containing tin is formed on the surface of the copper layer.

The method for forming the solder layer is not particularly limited, and examples thereof include electrolytic plating.

To the surface of the solder layer, at least one of nickel and cobalt is adhered.

The method for adhering at least one of nickel and cobalt to the surface of the solder layer is not particularly limited, and examples thereof include sputtering and electroless plating.

An anisotropic electroconductive material can be produced by dispersing the electroconductive microparticles of the present invention in a binder resin. Such an anisotropic electroconductive material is also encompassed by the present invention.

Examples of the anisotropic electroconductive material of the present invention include anisotropic electroconductive pastes, anisotropic electroconductive ink, anisotropic electroconductive adhesives, anisotropic electroconductive films, and anisotropic electroconductive sheets.

The binder resin is not particularly limited, and examples thereof include vinyl resins, thermoplastic resins, curable resins, thermoplastic block copolymers, and elastomers.

The vinyl resins are not particularly limited, and examples thereof include vinyl acetate resins, acrylic resins, and styrene resins. The thermoplastic resins are not particularly limited, and examples thereof include polyolefin resins, ethylene-vinyl acetate copolymers, and polyamide resins. The curable resins are not particularly limited, and examples thereof include epoxy resins, urethane resins, polyimide resins, and unsaturated polyester resins. The thermoplastic block copolymers are not particularly limited, and examples thereof include styrene-butadiene-styrene block copolymers, styrene-isoprene-styrene block copolymers, hydrogenated styrene-butadiene-styrene block copolymers, and hydrogenated styrene-isoprene-styrene block copolymers. Each of these resins may be used alone or two or more of these may be used in combination.

The curable resin may be any of a cold setting resin, a thermosetting resin, a photocurable resin, and a moisture curable resin.

The anisotropic electroconductive material of the present invention may optionally contain various additives such as bulking agents, plasticizers, adhesiveness improvers, antioxidants, heat stabilizers, light stabilizers, ultraviolet absorbers, colorants, flame retardants, and organic solvents.

The method for producing the anisotropic electroconductive material of the present invention is not particularly limited. In an exemplary method, the electroconductive microparticles of the present invention are added to the binder resin and mixed to be dispersed uniformly, thereby producing an anisotropic electroconductive paste, anisotropic electroconductive ink, anisotropic electroconductive adhesive, or the like. In another exemplary method for producing the anisotropic electroconductive material of the present invention, the electroconductive microparticles of the present invention are added to the binder resin and dispersed uniformly or heat-molten. The resulting product is applied to a release-treated surface of a mold-release material (e.g., a mold-release paper, a mold-release film) to a predetermined thickness and optionally dried or cooled, thereby producing an anisotropic electroconductive film, anisotropic electroconductive sheet, or the like. The production method can be selected as appropriate corresponding to the kind of the anisotropic electroconductive material.

The binder resin and the electroconductive microparticles of the present invention may be individually used as an anisotropic electroconductive material, without being mixed together.

An electroconductive connection structure comprising the electroconductive microparticles of the present invention or the anisotropic electroconductive material of the present invention is also encompassed by the present invention.

The electroconductive connection structure of the present invention is an electroconductive connection structure wherein the electroconductive microparticles of the present invention or the anisotropic electroconductive material of the present invention is filled between a pair of circuit substrates to connect the circuit substrates.

Advantageous Effects of Invention

The present invention can provide electroconductive microparticles which hardly cause disconnection due to breakage of connection interfaces between electrodes and the electroconductive microparticles even under application of an impact by dropping or the like and are less likely to be fatigued even after repetitive heating and cooling. The present invention can also provide an anisotropic electroconductive material and an electroconductive connection structure each produced using the electroconductive microparticles.

BRIEF DESCRIPTION OF DRAWINGS

FIG. 1 is a schematic view illustrating a preferred embodiment of the electroconductive microparticles of the present invention.

DESCRIPTION OF EMBODIMENTS

Embodiments of the present invention are specifically described with reference to, but not limited to, examples in the following.

Example 1

(1) Production of Resin Core Particles

Divinylbenzene (50 parts by weight) and tetramethylol methane tetraacrylate (50 parts by weight) were copolymerized to produce resin core particles (average particle size of 180 μm, CV value of 0.42%).

(2) Production of Electroconductive Microparticles

Electroless nickel plating was performed on the resulting core particles to form a base nickel plating layer having a thickness of 0.3 μm on the surface of each core particle. Next, a copper layer (electroconductive metal layer) having a thickness of 7 μm was formed thereon by electrolytic copper plating. A nickel layer (barrier layer) having a thickness of 0.6 μm was formed thereon by electrolytic nickel plating. A copper layer having a thickness of 1 μm was formed thereon by electrolytic copper plating. A solder layer containing tin with a thickness of 34 μm was formed thereon by electrolytic plating. Finally, the electrolytic plating liquid was filtered and the resulting particles were washed with water. The particles were then dried in a vacuum dryer at 50° C. to give electroconductive microparticles each including, on the surface of a core particle, a base metal layer, an electroconductive metal layer, a barrier layer, a copper layer, and a solder layer formed in said order.

In the obtained electroconductive microparticles, the ratio of copper contained in the copper layer directly in contact with the solder layer relative to tin contained in the solder layer was 2.6% by weight.

Example 2

Electroconductive microparticles each including a base metal layer, an electroconductive metal layer, a barrier layer, a copper layer, and a solder layer formed in said order on the surface of a core particle were produced in the same manner as in Example 1, except that the copper layer directly in contact with the solder layer had a thickness of 0.4 μm.

In the obtained electroconductive microparticles, the ratio of copper contained in the copper layer directly in contact with the solder layer relative to tin contained in the solder layer was 1.0% by weight.

Example 3

Electroconductive microparticles each including a base metal layer, an electroconductive metal layer, a barrier layer, a copper layer, and a solder layer formed in said order on the surface of a core particle were produced in the same manner as in Example 1, except that the copper layer directly in contact with the solder layer had a thickness of 2 μm.

In the obtained electroconductive microparticles, the ratio of copper contained in the copper layer directly in contact with the solder layer relative to tin contained in the solder layer was 5.0% by weight.

Example 4

Electroconductive microparticles each including a base metal layer, an electroconductive metal layer, a barrier layer, a copper layer, and a solder layer formed in said order on the surface of a core particle were produced in the same manner as in Example 1, except that the copper layer directly in contact with the solder layer had a thickness of 0.2 μm.

In the obtained electroconductive microparticles, the ratio of copper contained in the copper layer directly in contact with the solder layer relative to tin contained in the solder layer was 0.5% by weight.

Example 5

Electroconductive microparticles each including a base metal layer, an electroconductive metal layer, a barrier layer, a copper layer, a solder layer, and nickel adhered to the solder layer formed in said order on the surface of a core particle were produced in the same manner as in Example 1, except that nickel was adhered to the surface of the solder layer by sputtering.

Example 6

Electroconductive microparticles each including a base metal layer, an electroconductive metal layer, a barrier layer, a copper layer, a solder layer, and nickel adhered to the solder layer formed in said order on the surface of a core particle were produced in the same manner as in Example 1, except that nickel was adhered to the surface of the solder layer by electroless plating.

Example 7

Electroconductive microparticles each including a base metal layer, an electroconductive metal layer, a barrier layer, a copper layer, a solder layer, and cobalt adhered to the solder layer formed in said order on the surface of a core particle were produced in the same manner as in Example 1, except that cobalt was adhered to the surface of the solder layer by electroless plating.

Example 8

(1) Production of Resin Core Particles

Divinylbenzene (50 parts by weight) and tetramethylol methane tetraacrylate (50 parts by weight) were copolymerized to give resin core particles (average particle size of 150 μm, CV value of 0.38%).

(2) Production of Electroconductive Microparticles

Electroless nickel plating was performed on the resulting core particles to form a base nickel plating layer having a thickness of 0.3 μm on the surface of each particle. Next, a copper layer (electroconductive metal layer) having a thickness of 10 μm was formed thereon by electrolytic copper plating. A nickel layer (barrier layer) having a thickness of 0.6 μm was formed thereon by electrolytic nickel plating. A copper layer having a thickness of 0.5 μm was formed thereon by electrolytic copper plating. A solder layer containing tin with a thickness of 40 μm was formed thereon by electrolytic plating. Finally, the electrolytic plating liquid was filtered and the resulting particles were washed with water. The particles were then dried in a vacuum dryer at 50° C. to give electroconductive microparticles each including, on the surface of a core particle, a base metal layer, an electroconductive metal layer, a barrier layer, a copper layer, and a solder layer formed in said order.

In the obtained electroconductive microparticles, the ratio of copper contained in the copper layer directly in contact with the solder layer relative to tin contained in the solder layer was 1.0% by weight.

Example 9

Electroconductive microparticles each including a base metal layer, an electroconductive metal layer, a barrier layer, a copper layer, a solder layer, and nickel adhered to the solder layer formed in said order on the surface of a core particle were produced in the same manner as in Example 8, except that nickel was adhered to the surface of the solder layer by electroless plating.

Example 10

Electroconductive microparticles each including a base metal layer, an electroconductive metal layer, a barrier layer, a copper layer, a solder layer, and cobalt adhered to the solder layer formed in said order on the surface of a core particle were produced in the same manner as in Example 1, except that cobalt was adhered to the surface of the solder layer by electroless plating.

Comparative Example 1

Electroconductive microparticles each including a base metal layer, an electroconductive metal layer, a barrier layer, and a solder layer formed in said order on the surface of a core particle were produced in the same manner as in Example 1, except that the copper layer directly in contact with the solder layer was not formed.

Comparative Example 2

Electroconductive microparticles each including a base metal layer, an electroconductive metal layer, a barrier layer, a copper layer, and a solder layer formed in said order on the surface of a core particle were produced in the same manner as in Example 1, except that the copper layer directly in contact with the solder layer was formed by electroless plating and had a thickness of 0.05 μm.

In the obtained electroconductive microparticles, the ratio of copper contained in the copper layer directly in contact with the solder layer relative to tin contained in the solder layer was 0.1% by weight.

Comparative Example 3

Electroconductive microparticles each including a base metal layer, an electroconductive metal layer, a barrier layer, a copper layer, and a solder layer formed in said order on the surface of a core particle were produced in the same manner as in Example 1, except that the copper layer directly in contact with the solder layer had a thickness of 4 μm.

In the obtained electroconductive microparticles, the ratio of copper contained in the copper layer directly in contact with the solder layer relative to tin contained in the solder layer was 10% by weight.

Comparative Example 4

Electroconductive microparticles each including a base metal layer, an electroconductive metal layer, a barrier layer, a copper layer, a solder layer, and nickel adhered to the solder layer formed in said order on the surface of a core particle were produced in the same manner as in Comparative Example 2, except that nickel was adhered to the surface of the solder layer by electroless plating.

Comparative Example 5

Electroconductive microparticles each including a base metal layer, an electroconductive metal layer, a barrier layer, a copper layer, a solder layer, and cobalt adhered to the solder layer formed in said order on the surface of a core particle were produced in the same manner as in Comparative Example 2, except that cobalt was adhered to the surface of the solder layer by electroless plating.

Comparative Example 6

Electroconductive microparticles each including a base metal layer, an electroconductive metal layer, a barrier layer, and a solder layer formed in said order on the surface of a core particle were produced in the same manner as in Example 8, except that the copper layer directly in contact with the solder layer was not formed.

Comparative Example 7

Electroconductive microparticles each including a base metal layer, an electroconductive metal layer, a barrier layer, a copper layer, and a solder layer formed in said order on the surface of a core particle were produced in the same manner as in Example 8, except that the copper layer directly in contact with the solder layer was formed by electroless plating and had a thickness of 0.1 μm.

In the obtained electroconductive microparticles, the ratio of copper contained in the copper layer directly in contact with the solder layer relative to tin contained in the solder layer was 0.2% by weight.

Comparative Example 8

Electroconductive microparticles each including a base metal layer, an electroconductive metal layer, a barrier layer, a copper layer, a solder layer, and nickel adhered to the solder layer formed in said order on the surface of a core particle were produced in the same manner as in Comparative Example 7, except that nickel was adhered to the surface of the solder layer by electroless plating.

Comparative Example 9

Electroconductive microparticles each including a base metal layer, an electroconductive metal layer, a barrier layer, a copper layer, a solder layer, and cobalt adhered to the solder layer formed in said order on the surface of a core particle were produced in the same manner as in Comparative Example 2, except that cobalt was adhered to the surface of the solder layer by electroless plating.

(Evaluation)

The electroconductive microparticles of the examples and the comparative examples were evaluated for the following items. Table 1 shows the results.

(1) Measurement of Copper Concentration of Solder Layer after Heating at 150° C. for 12 Hours Each of the obtained electroconductive microparticles was heated at 150° C. for 12 hours, and the cross sections of the particles were taken. Five particles were selected and two points of each particle (10 points in total) were measured for the copper concentration (% by weight) of the solder layer with SEM-EDX. The minimum value, the maximum value, and the arithmetic average of the copper concentrations were determined.

(2) Drop Strength Test

Silicon chips (5 mm in height×5 mm in width) each provided with 121 electrode lands (diameter of 230 μm) at 0.4 mm pitch were prepared, and a flux ("WS-9160-M7" by Cookson Electronics) was applied to the electrode lands. Each of the obtained electroconductive microparticles was placed on all the electrode lands and subjected to reflowing (heating temperature of 250° C., 30 seconds) to be mounted on the electrode lands.

Next, a solder paste ("M705-GRN360-K2-V" by Senju Metal Industry Co., Ltd.) was applied to a printed substrate having a copper electrode (diameter of 250 μm) formed thereon. Fifteen silicon chips with the electroconductive microparticles mounted thereon were placed on the printed substrate and subjected to reflowing (heating temperature of 250° C., 30 seconds) to be mounted on the printed substrate. In this manner, an electroconductive connection structure was prepared.

The drop strength test was performed on the obtained electroconductive connection structure in conformity with JESD22-B111 of the JEDEC standard. Since the obtained electroconductive connection structure had a daisy chain circuit formed therein, even a disconnection of the electrode land at only one point can be detected.

The number of times of dropping needed for disconnecting all the 15 silicon chips was counted.

Here, the electrode lands were formed in the copper layer. The same shall apply in the following.

(3) Temperature Cycle Test

A silicon chip (5 mm in height×5 mm in width) provided with 121 electrode lands (diameter of 230 μm) at 0.4 mm pitch was prepared, and a flux ("WS-9160-M7" by Cookson Electronics) was applied to the electrode lands. Each of the obtained electroconductive microparticles was placed on all the electrode lands and subjected to reflowing (heating temperature of 250° C., 30 seconds) to be mounted on the electrode lands.

Next, a solder paste ("M705-GRN360-K2-V" by Senju Metal Industry Co., Ltd.) was applied to a printed substrate having a copper electrode (diameter of 250 μm) formed thereon. One silicon chip with the electroconductive microparticles mounted thereon was placed on the printed substrate and subjected to reflowing (heating temperature of 250° C., 30 seconds) to be mounted on the printed substrate. In this manner, an electroconductive connection structure was obtained.

Since the resulting electroconductive connection structure had a daisy chain circuit formed therein, even a disconnection of the electrode land at only one point can be detected.

A temperature cycle test in which a temperature change from −40° C. to 125° C. was set as one cycle was performed on the resulting electroconductive connection structure. In the heat profile of the temperature cycle test, the temperature was kept at −40° C. for 10 minutes, increased from −40° C. to 125° C. over 2 minutes, kept at 125° C. for 10 minutes, and decreased from 125° C. to −40° C. over 2 minutes.

The evaluation of the temperature cycle test was performed based on the following criteria.

○ (Good): 1000 cycles or more were repeated before the disconnection of the electroconductive connection structure was confirmed.

x (Poor): Less than 1000 cycles were repeated before the disconnection of the electroconductive connection structure was confirmed.

TABLE 1

| | Ratio of copper directly in contact with solder layer (% by weight) | Copper concentration of solder layer after heating at 150° C. for 12 hours (% by weight) | | | Number of times of dropping in drop strength test (times) | Temperature cycle test |
|---|---|---|---|---|---|---|
| | | Minimum | Maximum | Average | | |
| Example 1 | 2.6 | 0.76 | 30.54 | 11.24 | 1289 | ○ |
| Example 2 | 1.0 | 0.63 | 15.35 | 6.83 | 1157 | ○ |
| Example 3 | 5.0 | 1.96 | 38.24 | 13.99 | 1092 | ○ |
| Example 4 | 0.5 | 0.51 | 4.34 | 2.20 | 1016 | ○ |
| Example 5 | 2.6 | 0.89 | 28.15 | 10.75 | 1493 | ○ |
| Example 6 | 2.6 | 1.02 | 29.57 | 9.94 | 1528 | ○ |
| Example 7 | 2.6 | 0.63 | 23.40 | 11.41 | 1669 | ○ |
| Example 8 | 1.0 | 0.59 | 18.16 | 7.22 | 1017 | ○ |
| Example 9 | 1.0 | 0.92 | 20.15 | 7.87 | 1249 | ○ |
| Example 10 | 1.0 | 1.06 | 15.10 | 7.75 | 1364 | ○ |
| Comparative Example 1 | 0.0 | 0.02 | 0.15 | 0.09 | 589 | X |
| Comparative Example 2 | 0.1 | 0.08 | 0.43 | 0.23 | 673 | X |
| Comparative Example 3 | 10.0 | 8.96 | 62.58 | 40.26 | 439 | X |
| Comparative Example 4 | 0.1 | 0.05 | 0.41 | 0.23 | 804 | X |
| Comparative Example 5 | 0.1 | 0.06 | 0.49 | 0.27 | 859 | X |
| Comparative Example 6 | 0.0 | 0.01 | 0.14 | 0.06 | 496 | X |
| Comparative Example 7 | 0.2 | 0.08 | 0.64 | 0.34 | 587 | X |
| Comparative Example 8 | 0.2 | 0.16 | 0.87 | 0.42 | 665 | X |
| Comparative Example 9 | 0.1 | 0.08 | 0.62 | 0.39 | 718 | X |

Example 11

The particles of Example 1 were dispersed in a binder resin and the circuit connection was executed. As a result, electrical connection was confirmed.

INDUSTRIAL APPLICABILITY

The present invention can provide electroconductive microparticles which are less likely to cause disconnection due to breakage of connection interfaces between electrodes and the electroconductive microparticles even under application of an impact by dropping or the like and are less likely to be fatigued even after repetitive heating and cooling. The present invention can further provide an anisotropic electroconductive material and an electroconductive connection structure each produced using the electroconductive microparticles.

REFERENCE SIGNS LIST

1. Core particle
2. Base metal layer
3. Electroconductive metal layer
4. Barrier layer
5. Copper layer
6. Solder layer
7. At least one of nickel and cobalt adhered to solder layer

The invention claimed is:

1. Electroconductive microparticles used for conductive connection of electronic circuit substrates having copper electrodes each comprising at least an electroconductive metal layer comprising copper, a barrier layer comprising nickel, a copper layer, and a solder layer containing tin that are laminated in said order on a surface of a core particle made of a resin, the copper layer and the solder layer being in contact with each other directly, the copper layer contains copper at a ratio of 0.5 to 5% by weight relative to tin contained in the solder layer.

2. The electroconductive microparticles according to claim 1, wherein the concentration of the copper at any given point in the solder layer is 0.5 to 40% by weight after heating at 150° C. for 12 hours.

3. The electroconductive microparticles according to claim 1, wherein at least one of nickel and cobalt is adhered to the surface of the solder layer.

4. An anisotropic electroconductive material comprising the electroconductive microparticles according to claim 1 dispersed in a binder resin.

5. An electroconductive connection structure comprising the electroconductive microparticles according to claim 1.

6. The electroconductive microparticles according to claim 2, wherein at least one of nickel and cobalt is adhered to the surface of the solder layer.

7. An anisotropic electroconductive material comprising the electroconductive microparticles according to claim 2 dispersed in a binder resin.

8. An anisotropic electroconductive material comprising the electroconductive microparticles according to claim 3 dispersed in a binder resin.

9. An anisotropic electroconductive material comprising the electroconductive microparticles according to claim 6 dispersed in a binder resin.

10. An electroconductive connection structure comprising the electroconductive microparticles according to claim 2.

11. An electroconductive connection structure comprising the electroconductive microparticles according to claim 3.

12. An electroconductive connection structure comprising the electroconductive microparticles according to claim 6.

* * * * *